US012700876B2

(12) United States Patent
Tang et al.

(10) Patent No.: US 12,700,876 B2
(45) Date of Patent: Aug. 4, 2026

(54) DATA ENCODING AND DECODING SCHEMES

(71) Applicant: Micron Technology, Inc., Boise, ID (US)

(72) Inventors: Xiangyu Tang, San Jose, CA (US); Eyal En Gad, Highland, CA (US); Huai-Yuan Tseng, San Ramon, CA (US)

(73) Assignee: Micron Technology, Inc., Boise, ID (US)

( * ) Notice: Subject to any disclaimer, the term of this patent is extended or adjusted under 35 U.S.C. 154(b) by 118 days.

(21) Appl. No.: 18/917,332

(22) Filed: Oct. 16, 2024

(65) Prior Publication Data

US 2025/0150094 A1     May 8, 2025

Related U.S. Application Data

(60) Provisional application No. 63/596,880, filed on Nov. 7, 2023.

(51) Int. Cl.
*H03M 7/00* (2006.01)
*G06F 7/74* (2006.01)
*H03M 7/30* (2006.01)

(52) U.S. Cl.
CPC ............. *H03M 7/6011* (2013.01); *G06F 7/74* (2013.01); *H03M 7/6005* (2013.01)

(58) Field of Classification Search
CPC .......................... H03M 7/6011; H03M 7/6005
USPC ........................................ 341/50, 51, 67, 65
See application file for complete search history.

(56) References Cited

U.S. PATENT DOCUMENTS

| | | | |
|---|---|---|---|
| 11,463,698 B2 | 10/2022 | Berry et al. | |
| 2006/0171481 A1* | 8/2006 | Ionescu ................. | H04L 1/0058 |
| | | | 375/267 |
| 2017/0109313 A1* | 4/2017 | Niesen .................... | H04L 12/40 |
| 2020/0351532 A1* | 11/2020 | Lee .................... | H04N 21/4223 |

* cited by examiner

*Primary Examiner* — Peguy Jean Pierre
(74) *Attorney, Agent, or Firm* — Brooks, Cameron & Huebsch, PLLC

(57) ABSTRACT

A method includes receiving user data having a number of first bits. The method further includes encoding the user data by generating a number of second encoded bits having a first quantity of bits greater than that of the number of first bits. The number of second encoded bits can include one or more bits having a particular binary value and a quantity of the one or more bits is less than a threshold quantity. The method further includes writing the number of second encoded bits as the user data to a memory.

20 Claims, 7 Drawing Sheets

213—

| Group | Base CW | Rank 0 ffset | Group Rank | Rank | CW |
|---|---|---|---|---|---|
| 0 | 11111 | 0 | 0 | 0 | 11111 |
| 1 | 11110 | 1 | 0 | 1 | 11110 |
| | | | 1 | 2 | 11101 |
| | | | 2 | 3 | 11011 |
| | | | 3 | 4 | 10111 |
| | | | 4 | 5 | 01111 |
| 2 | 11100 | 6 | 0 | 6 | 11100 |
| | | | 1 | 7 | 11010 |
| | | | 2 | 8 | 11001 |
| | | | 3 | 9 | 10110 |
| | | | 4 | 10 | 10101 |
| | | | 5 | 11 | 10011 |
| | | | 6 | 12 | 01110 |
| | | | 7 | 13 | 01101 |
| | | | 8 | 14 | 01011 |
| | | | 9 | 15 | 00111 |

213

| Group | Base CW | Rank Offset | Group Rank | Rank | CW |
|---|---|---|---|---|---|
| 0 | 11111 | 0 | 0 | 0 | 11111 |
| 1 | 11110 | 1 | 0 | 1 | 11110 |
| | | | 1 | 2 | 11101 |
| | | | 2 | 3 | 11011 |
| | | | 3 | 4 | 10111 |
| | | | 4 | 5 | 01111 |
| 2 | 11100 | 6 | 0 | 6 | 11100 |
| | | | 1 | 7 | 11010 |
| | | | 2 | 8 | 11001 |
| | | | 3 | 9 | 10110 |
| | | | 4 | 10 | 10101 |
| | | | 5 | 11 | 10011 |
| | | | 6 | 12 | 01110 |
| | | | 7 | 13 | 01101 |
| | | | 8 | 14 | 01011 |
| | | | 9 | 15 | 00111 |

| | 234 | 236 | 238 |
|---|---|---|---|
| | Shift | Bit 0 | Bit 1 |
| 242 | 0 | 0 | 0 |
| 244 | 1 | 1 | 1 |
| 246 | 2 | 2 | 3 |
| 248 | 3 | 3 | 6 |

*FIG. 2B*

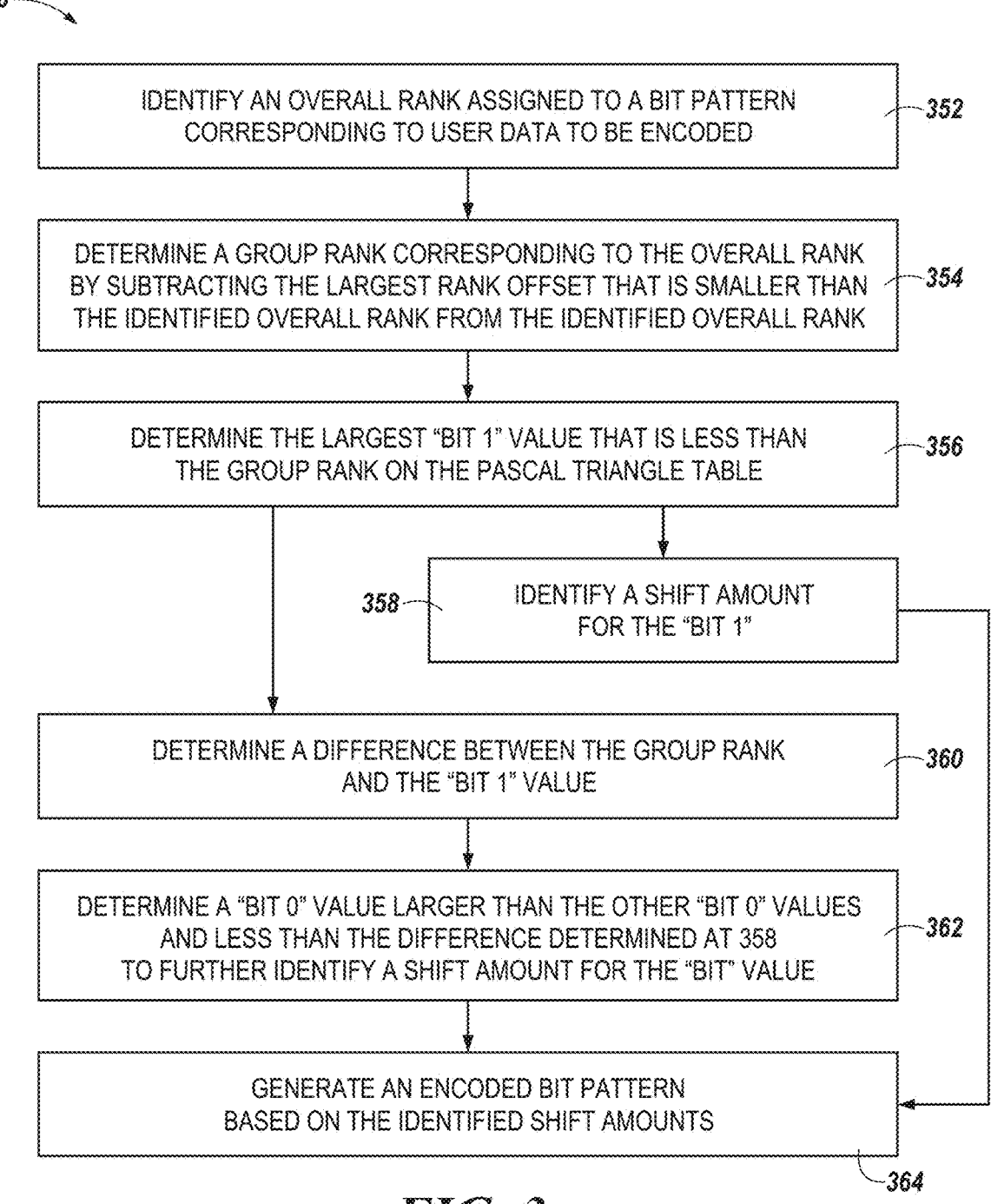

350

IDENTIFY AN OVERALL RANK ASSIGNED TO A BIT PATTERN
CORRESPONDING TO USER DATA TO BE ENCODED — 352

DETERMINE A GROUP RANK CORRESPONDING TO THE OVERALL RANK
BY SUBTRACTING THE LARGEST RANK OFFSET THAT IS SMALLER THAN
THE IDENTIFIED OVERALL RANK FROM THE IDENTIFIED OVERALL RANK — 354

DETERMINE THE LARGEST "BIT 1" VALUE THAT IS LESS THAN
THE GROUP RANK ON THE PASCAL TRIANGLE TABLE — 356

358 — IDENTIFY A SHIFT AMOUNT
FOR THE "BIT 1"

DETERMINE A DIFFERENCE BETWEEN THE GROUP RANK
AND THE "BIT 1" VALUE — 360

DETERMINE A "BIT 0" VALUE LARGER THAN THE OTHER "BIT 0" VALUES
AND LESS THAN THE DIFFERENCE DETERMINED AT 358
TO FURTHER IDENTIFY A SHIFT AMOUNT FOR THE "BIT" VALUE — 362

GENERATE AN ENCODED BIT PATTERN
BASED ON THE IDENTIFIED SHIFT AMOUNTS — 364

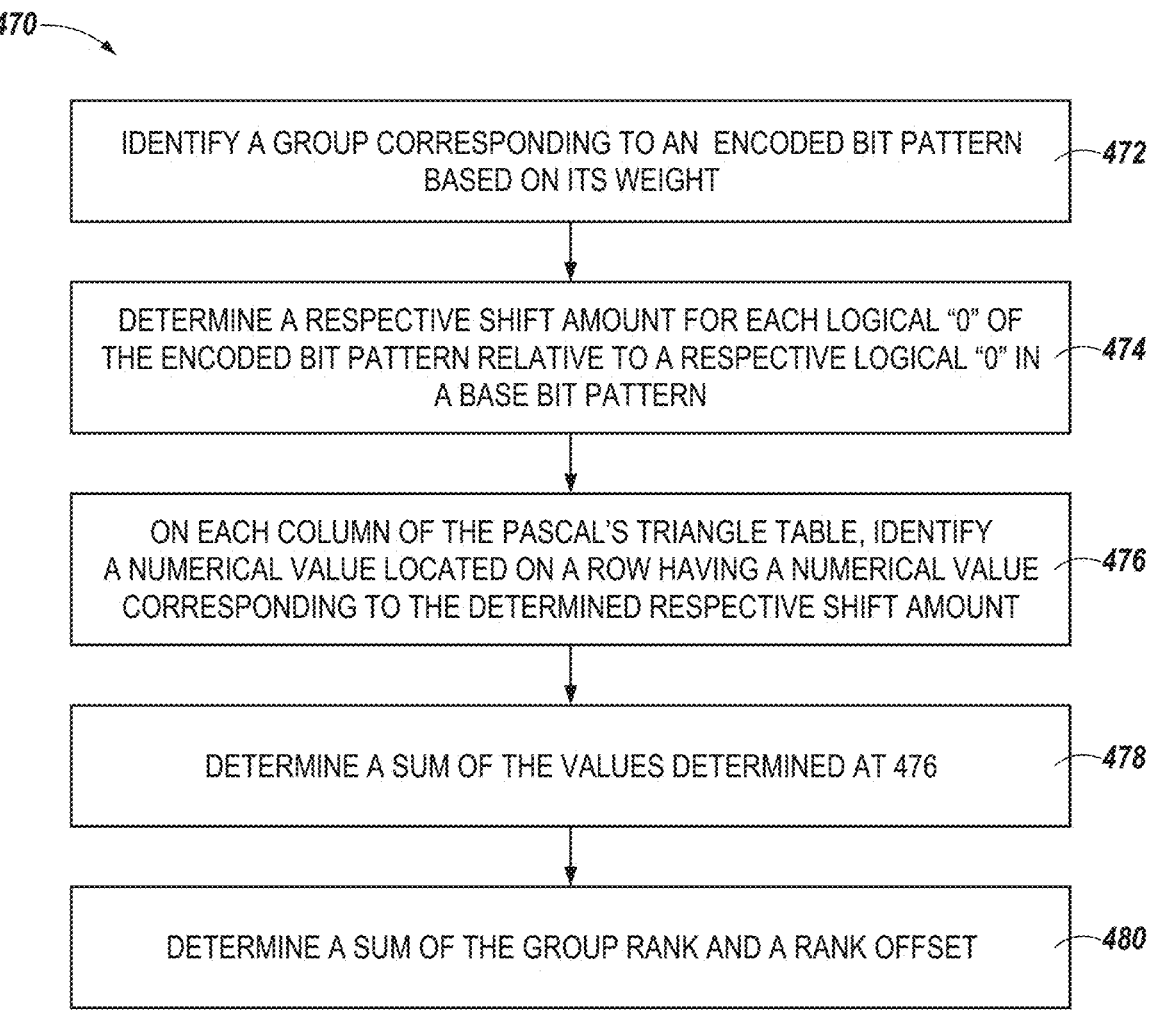

IDENTIFY A GROUP CORRESPONDING TO AN ENCODED BIT PATTERN BASED ON ITS WEIGHT — 472

DETERMINE A RESPECTIVE SHIFT AMOUNT FOR EACH LOGICAL "0" OF THE ENCODED BIT PATTERN RELATIVE TO A RESPECTIVE LOGICAL "0" IN A BASE BIT PATTERN — 474

ON EACH COLUMN OF THE PASCAL'S TRIANGLE TABLE, IDENTIFY A NUMERICAL VALUE LOCATED ON A ROW HAVING A NUMERICAL VALUE CORRESPONDING TO THE DETERMINED RESPECTIVE SHIFT AMOUNT — 476

DETERMINE A SUM OF THE VALUES DETERMINED AT 476 — 478

DETERMINE A SUM OF THE GROUP RANK AND A RANK OFFSET — 480

RECEIVING USER DATA HAVING A NUMBER OF FIRST BITS — 592

ENCODING THE USER DATA BY GENERATING A NUMBER OF
SECOND ENCODED BITS HAVING A FIRST QUANTITY OF BITS
GREATER THAN THAT OF THE NUMBER OF FIRST BITS — 594

WRITING THE NUMBER OF SECOND ENCODED BITS AS
THE USER DATA TO A MEMORY — 596

DATA ENCODING AND DECODING SCHEMES

PRIORITY INFORMATION

This Application claims the benefit of U.S. Provisional Application No. 63/596,880, filed on Nov. 7, 2023, the contents of which are incorporated herein by reference.

TECHNICAL FIELD

Embodiments of the disclosure relate generally to memory sub-systems, and more specifically, relate to data encoding and decoding schemes.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIG. 2A illustrates an example table for encoding and decoding schemes in accordance with some embodiments of the present disclosure.

FIG. 2B illustrates another example table for encoding and decoding schemes in accordance with some embodiments of the present disclosure.

FIG. 3 illustrates a flow diagram of an encoding process of user data in accordance with some embodiments of the present disclosure.

FIG. 4 illustrates a flow diagram of a decoding process of the encoded user data in accordance with some embodiments of the present disclosure.

DETAILED DESCRIPTION

Figure 1:
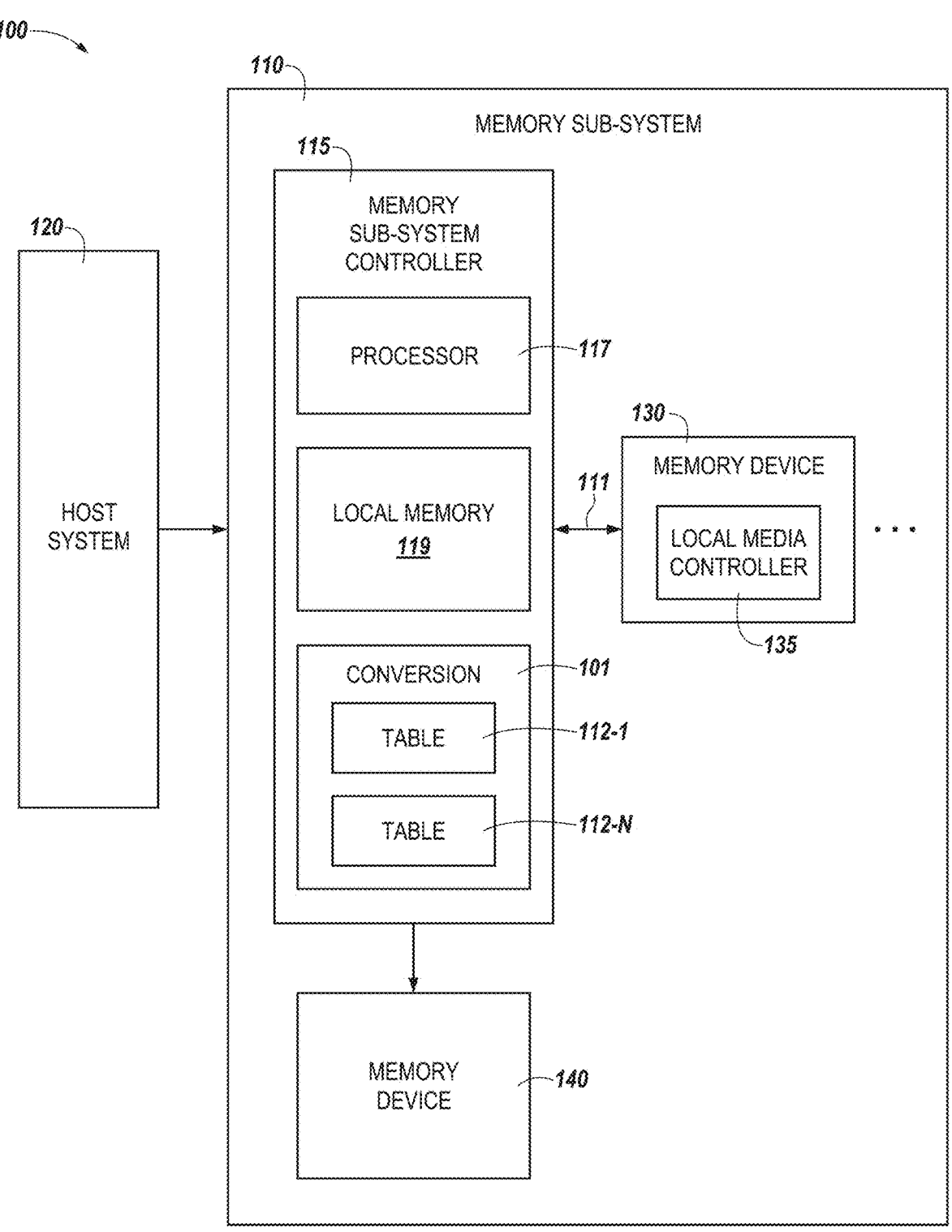
FIG. 1 illustrates an example computing system that includes a memory sub-system in accordance with some embodiments of the present disclosure.

Aspects of the present disclosure are directed to data encoding and decoding schemes. A memory sub-system can be a storage system, storage device, a memory module, or a combination of such. An example of a memory sub-system is a storage system such as a solid-state drive (SSD). Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

In NAND architecture, programming a memory cell involves applying programming voltages to the memory cell to trap electrons in a floating gate; thereby, programming the memory cell to a programmed state (e.g., a logical "0"). To revert the logical state of the programmed memory cell, the memory cells may be erased in a unit of block of NAND memory cells, which tunnels electrons that have been trapped in the floating gates out of the memory cells; thereby, programming the memory cells to an erased state (e.g., a logical "1"). Accordingly, programming NAND memory cells typically involves applying programming voltages to those memory cells that are in an erased state (e.g., a logical "1") to be programmed to a programmed state (e.g., a logical "0"), while the opposite logical state change (e.g., from a logical "0" to a logical "1") has been done by the NAND erase operations by applying erase voltage to the memory cells. This programming characteristic of the NAND architecture is referred to as "write once".

Consequently, the number of memory cells programmed to a specific state during each program/erase cycle is generally proportional to the degradation of NAND memory cell endurance. For instance, if assuming that the memory cells can tolerate 200 k program/erase cycles ("P/E cycle") when programming voltages are applied to 50% of the memory cells during each program cycle, the memory cells can only tolerate 100 k program/erase cycles when the programming voltages are applied to all (100%) of the memory cells in each program cycle. This indicates that a larger number of logical "0"s programmed to NAND memory cells in each program cycle may result in worsened endurance compared to NAND memory cells that have fewer logical "0"s programmed in each program cycle. While it is desired to reduce a quantity of logical "0"s to be programmed to NAND memory cells, reducing as such would give less variations or permutations of potential data patterns that may be stored in the NAND memory cells; thereby, reducing an amount of information the NAND memory cells can store.

Aspects of the present disclosure address the above and other deficiencies by providing encoding and decoding schemes, as described herein. The encoding and decoding schemes herein convert (e.g., encode) user data to a different or converted format (alternatively referred to as "encoded user data") that has a quantity of logical "0"s that is less than a quantity of the logical "0" is in the unconverted user data. For instance, the encoded user data may have a greater quantity of bits but have a quantity of logical "0"s that is less than a quantity of the logical "0" is in the unconverted user data. The resultant encoded user data may be stored thereby ensuring that a quantity of stored logical "0"s is less than the quantity of logical "0"s in the unconverted user data. This decrease in the quantity of logical "0"s that is stored provides benefits including a reduction in a quantity of flipping bits (e.g., from a logical "1" to a logical "0") during program cycles and therefore a reduction in a rate of memory cell degradation, and yet the approaches herein maintain a high degree of variation or permutations for potential bit patterns that can be stored on memory cells thereby improving the functioning of memory subs-systems employing the approaches herein.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via the same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can include a conversion component 101, which can convert a format of bits to one (e.g., a format corresponding to encoded bits) to the other (e.g., a format corresponding to decoded bits or bits as originally received from the host 120) or vice versa.

Although not shown in FIG. 1 so as to not obfuscate the drawings, the conversion component 101 can include various circuitry and/or components to facilitate encoding user data received from the host system 120 and/or decoding encoded user data in accordance with a number of embodiments described herein. For example, the conversion component 101 can receive k bits of user data from the host system 120 and encode "k" bits into "n" bits (n>k) of encoded user data. In some embodiments, there can be a (e.g., predetermined) list of bit patterns having n bits to which user data having k bits can be encoded to. For example, assuming that "k" and "n" are 2 and 4 respectively, 2 bits of user data have four different bit patterns (e.g., "00", "01", "10", "11"). While 4 bits can have sixteen different bit patterns at the most, four bit patterns that have less logical "0"s among those different bit patterns derivable from 4 bits can be selected for encoding/decoding schemes. For example, while 4 bits can have sixteen different bit patterns, such as "1111", "1110", "1101", "1011", "0111", "1100", "1010", "0110", "1001", "0101", "0011", "0001", "0010", "0100", "1000", "0000", first four bit patterns ("1111", "1110", "1101", "1011") that have relatively less logical "0"s can be selected for the list and use for the encoding/decoding schemes, as described herein.

The endurance gain (a degree by which the endurance is improved) can be further improved proportional to the rate at which logical "0"s are reduced when encoded. For example, the endurance gain can be expressed as follows:

$$\text{an endurance gain expressed based on R and Po'} \quad TBW_{gain} = \frac{R}{2Po}, \qquad \text{Equation (1)}$$

Equation (1): an endurance gain expressed based on R and Po'

In the above equation, the endurance gain is represented by TBWgain, in which "TBW" stands for Terabytes Written, the rate is represented by "R", and "Po" represents an average quantity of logical "0"s programed on memory cells. To further boost "TBWgain", "R" needs to be increased, while "Po" needs to be decreased. Considering the above example, in which 2 bits of user data as originally received from the host system 120 are encoded into 4 bits with no more than 2 bits being a logical "0", the rate becomes 2/4. Assuming that "Po" is 3/4 (e.g., 3 out of 4 bits being programmed to memory cells are a logical "0" in average), the endurance gain is:

$$\frac{\frac{2}{4}}{2*\left(\frac{3}{4}\right)} = \frac{1}{3}$$

Accordingly, with the rate of 2/4, the endurance is improved by 33% (in TBW).

The conversion component can further store various information in the form of tables, such as tables 112-1, . . . , 112-N. The information stored on the table 112-1, . . . , 112-N can include mappings between various parameters, which can either allow direct conversion between k bits of user data and n bits of encoded user data (e.g., by using an "overall rank" described in association with FIG. 2A as a medium) or allow calculation of an overall rank, which then can be used to obtain either the k bits of user data (for decoding process) or the n bits of encoded user data (for encoding process). Further details of information that can be stored in the tables 112-1, . . . , 112-N are described in association with FIGS. 2A-2B.

In a non-limiting example, an apparatus (e.g., the computing system 100) can include a memory (e.g., memory devices 130, 140) and a controller (e.g., a memory subsystem controller 115) coupled to the memory. The controller can be configured to identify, in response to receiving user data having a number of first bits and to encode the user data, a first numerical value corresponding to a first overall rank of a plurality of overall ranks (e.g., listed in column 228 of table 213) distributed across a plurality of groups (e.g., listed in column 220). The first overall rank is assigned to the number of first bits and each group of the plurality of groups includes one or more bit patterns (e.g., listed in column 232) that includes a same quantity of bits having a particular binary value. The controller can be further configured to write, in response to a number of second bits being determined as corresponding to the first overall rank, the number of second bits to the memory as the encoded user data. The number of second bits can include a first quantity of bits that is greater than that of the number of first bits and a second quantity of bits having the particular binary value among the number of second bits. The second quantity of bits can be less than a threshold quantity. Further, in some embodiments, the threshold quantity can equal to or less than a half of the first quantity.

In some embodiments, the controller can be further configured to apply a programming voltage, to write the number of second bits to a group of memory cells of the memory, one or more programming voltages to one or more memory cells of the group to be programmed to the particular binary value. Further, a programming voltage may not be applied to memory cells of the group that are to be programmed to a different binary value (e.g., since the memory cells are already in the different binary value, such as "1").

In some embodiments, the first overall rank can be one of the overall ranks corresponding to a first group of the plurality of groups. The controller can be configured to determine a second numerical value corresponding to a second overall rank (e.g., listed in column 224 or alternatively in column 228 of table 213) assigned to a base bit pattern (e.g., listed in column 222 of table 213) of the first group and that is less than the other numerical values corresponding to the other overall ranks of the first group. As illustrated in FIG. 2A, bits having the particular binary values among bits of the base bit pattern are located consecutively from a bit position of the base bit pattern and corresponding to a least most significant bit (LSB). The controller can be further configured to determine a third numerical value corresponding to a first group rank (e.g., listed in column 226 of table 213) among a plurality of group ranks of the first group based on a comparison between the first numerical value and the second numerical value.

Continuing with this example, the controller can be further configured to identify, among a plurality of numerical values on a first column (e.g., column 238) of a first table (e.g., table 216), a fourth numerical value that is greater than the other numerical values on the first column and less than the third numerical value. A respective one of the plurality of numerical values of the first column can be a result of a sum of a numerical value of the plurality of numerical values on a preceding row and a numerical value on a second column (e.g., column 236 of table 216) of the first table and the same row as the fourth numerical value.

Further continuing with this example, a plurality of numerical values respectively on rows of a third column (e.g., column 234 of table 316) of the first table respectively can correspond to a plurality of shift amounts, in which a shift amount in each row is incremented by one compared to a shift amount in a respective preceding row. The number of second bits can include a first bit (e.g., "Bit 1" shown in table 216) and a second bit (e.g., "Bit 0" shown in table 216) each having the particular binary value among the number of second bits. More specifically, a bit position of the first bit is shifted by a first shift amount relative to a bit position of a third bit of the base bit pattern, in which the first shift amount corresponds to a respective shift amount on the third column and the same row as the fourth numerical value. Further, a bit position of the second bit is shifted by a second shift amount relative to a bit position of a fourth bit of the base bit pattern. In this example, the third bit is located closer to or on a bit position corresponding to a most significant bit (MSB) of the base bit pattern than the fourth bit is and the second shift amount can be equal to or less than a difference between the second and fourth numerical values.

In another non-limiting example, an apparatus (e.g., computing system 100) can include a memory (e.g., memory devices 130, 140) configured to store a number of first encoded bits as user data. In this example, one or more bits having a particular binary value (e.g., a logical "0") among the number of first encoded bits can be less than a threshold quantity. The apparatus can further include a controller (e.g., memory sub-system controller 115) coupled to the memory. The controller can be configured to read the user data including the number of first encoded bits from the memory. The controller can be further configured to identify, to decode the user data, a first numerical value corresponding to a first overall rank among a plurality of overall ranks (e.g., listed in column 228 of table 213) distributed across a plurality of groups (e.g., listed in column 220) and assigned to the first number of bits. Each group of the plurality of groups can include one or more bit patterns (e.g., listed in column 232) that further include a same quantity of bits having the particular binary value. The controller can be further configured to generate, as a result of the number of first encoded bits being decoded, a number of second decoded bits. In this example, the number of second decoded bits can include a first quantity of bits that is less than that of the number of first encoded bits.

In some embodiments, the controller can be configured to identify a second overall rank (e.g., listed in column 224 or alternatively in column 228 of table 213) assigned to a base bit pattern (e.g., listed in column 222 of table 213) of a first group of the plurality of groups. In this example, bits having the particular binary value among bits of the base bit pattern can be located consecutively from a bit position of the base bit pattern corresponding to a least most significant bit (LSB). Further, each one of bit patterns of the first group can include a same quantity of bits having the particular binary value as the number of first encoded bits. The controller can be further configured to determine, to identify the first overall rank, a group rank (e.g., listed in column 226 of table 213) assigned to the number of first encoded bits based on a difference between the second overall rank and the group rank.

Continuing with this example, the number of first encoded bits can include a first bit having the particular binary value and a second bit having the particular binary value. The first bit can be located closer to or on a bit position corresponding to a most significant bit (MSB) of the number of first encoded bits than the second bit is. Further, the base bit pattern can include a third bit having the particular binary value and a fourth bit having the particular binary value. The third bit can be located closer to or on a bit position corresponding to a most significant bit (MSB) of the number of first encoded bits than the fourth bit is. The controller can be configured to determine a first shift amount (e.g., listed in column 234 of table 216) by which a bit position of the first bit is shifted relative to that of the third bit. The controller can be further configured to determine a second shift amount (e.g., listed in column 234 of table 216) by which a bit position of the second bit is shifted relative to that of the fourth bit.

Continuing with this example, a first table (e.g., table 216) can include a first column (e.g., column 234 of table 216) including a plurality of shift amounts respectively on rows of the first table, in which a shift amount in each row is incremented by one compared to a shift amount in a respective preceding row of the first column. The first table can further include a second column (e.g., column 234 of table 216), in which a numerical value in each row is incremented by one compared to a numerical value in a respective preceding row of the second column. The first table can further include a third column (e.g., column 238 of table 216), in which each numerical value in a respective row is a sum of a numerical value on a preceding row and the third column and a numerical value on the second column and the same row as the respective row of the first column.

Continuing with this example, the controller can be further configured to determine the group rank based on a sum of a second numerical value and a third numerical value. In this example, the second numerical value is on the second column and a first row (e.g., one of rows 242, 244, 246, and 248 of table 216) of the first table. Further, a numerical value on the second column and the first row further corresponds to the first shift amount. Further, in this example, the third numerical value is on the third column and a second row (e.g., one of rows 242, 244, 246, and 248 of table 216) of the first table. Further, a numerical value on the first column and the second row further corresponds to the second shift amount. The controller can be further configured to determine the first overall rank based on a sum of the group rank and the second overall rank.

FIG. 2A illustrates an example table 213 for encoding and decoding schemes in accordance with some embodiments of the present disclosure. For example, a portion of the information (e.g., information corresponding to respective columns of the table 213) can be included in one or more tables 112-1, . . . , 112-N illustrated in FIG. 1.

As shown in FIG. 2A, the table 213 illustrates 16 different bit patterns with each bit pattern having 5 bits. These 16 bit patterns can each represent one of 16 possible bit combinations (e.g., bit patterns) derivable from 4 bits of user data (prior to being encoded) as originally received from the host system 120. As illustrated in FIG. 2A, the 16 bit patterns have a quantity of logical "0"s no more than (less than or equal to) a threshold quantity, such as two logical "0"s in this example.

The 16 different bit patterns can be categorized into one of groups (e.g., indicated by a column 220) based on a quantity of logical "0"s in each bit pattern. For example, each group can include bit patterns that have a same quantity of logical "0"s. For example, as illustrated in FIG. 2A, a group "0" indicated by 221 includes a single bit pattern "11111" that does not include logical "0"s; a group "1" indicated by 223 includes 5 bit patterns each having one logical "0"; and a group "2" indicated by 225 includes 10 bit patterns each having two logical "0"s.

Each group can include one (e.g., single) base bit pattern with the least significant bit (LSB) having a logical "0", if any. For example, as further indicated by column 222, a base bit pattern of a group "1" (e.g., indicated by 223) corresponds to "11110" with "0" located on a bit position corresponding to the LSB and a base bit pattern of a group "2" (e.g., indicated by 225) corresponds to "11100" with "0" located on a bit position corresponding to the LSB. An additional logical "0" of the base bit pattern "11100" is sequentially located next to the LSB.

As further illustrated in FIG. 2A, 16 bit patterns can be respectively (and sequentially from top to bottom) assigned overall ranks ("RANK" shown in FIG. 2A) as listed in column 228. For example, a bit pattern "11111" of group 0 (e.g., 221 in FIG. 2A) is assigned an overall rank of "0"; bit patterns of group 1 (e.g., 223 in FIG. 2A) are respectively assigned overall ranks from "1" to "5"; and bit patterns of group 2 (e.g., 225 in FIG. 2A) are respectively assigned overall ranks from "6" to "15".

In a number of embodiments, overall ranks can serve as a medium by which user data as originally received are encoded or encoded user data are decoded. For example, encoding user data received from the host system 102 can involve identifying and/or determining (e.g., calculating) a corresponding overall rank, via which a bit pattern corresponding to encoded user data can be further identified and/or determined. Vice versa, decoding encoded user data read from the memory device 130, 140 can involve identifying and/or determining (e.g., calculating) a corresponding overall rank, via which a bit pattern corresponding to decoded user data can be further identified and/or determined.

Bit patterns can be respectively assigned "group ranks" as indicated by column 226, which indicates a rank of each bit pattern within the respective group (e.g., groups 0-2). For example, bit patterns of group 1 (e.g., 223 in FIG. 2A) are respectively assigned group ranks of "0" to "4" and bit patterns of group 2 (e.g., 225 in FIG. 2A) are respectively assigned group ranks of "0" to "9". Column 224 further indicates respective overall ranks (alternatively referred to as "rank offset" as shown in FIG. 2A) for each base bit pattern respective group ranks.

Information corresponding to respective columns 220, 222, 224, 226, 228, and 232 can be included in at least one of the tables 112-1, . . . , 112-N in various manners. For example, at least one of the tables 112 can include information corresponding to a direct mapping between bit patterns corresponding to decoded user data and overall ranks (e.g., column 228), bit patterns (e.g., columns 232) corresponding to encoded user data and overall ranks (e.g., column 228), base bit patterns (e.g., column 222) and their group ranks (e.g., column 224), or any combination thereof.

FIG. 2B illustrates another example table 216 encoding and decoding schemes in accordance with some embodiments of the present disclosure. Information stored on the table 216 can be stored on one of the tables 112-1, . . . , 112-N illustrated in FIG. 1.

The size of table 216 can be determined based on the threshold quantity of logical "0"s that an encoded bit pattern is allowed to have. Given that the threshold quantity is represented by "k" and a total quantity of bits an encoded bit pattern has is represented by "n", the table 216 can have (k+1) rows and (n−k) columns. For example, the table 216 illustrated in FIG. 2B is for encoding/decoding schemes involving encoded bit patterns each having a total 5 bits with no more than 2 logical "0"s. Therefore, the table 216 has 4 rows (6−2=4) and 3 columns (2+1=3) as shown in FIG. 2B.

A column 236 of table 216 corresponds to "Bit 1", which further corresponds to a logical "0" of a particular bit pattern and that is located on or closer to a bit position corresponding to the most significant bit (MSB) than the other logical "0"s of the particular bit pattern. A column 238 of table 216 corresponds to "Bit 0" which further corresponds to a logical "0" of the particular bit pattern that is located on or closer to a bit position corresponding to the LSB than the "Bit 1". For example, an example bit pattern of "01110" has a "Bit 1" located on a bit position corresponding to the MSB of the bit pattern and a "Bit 0" located on a bit position corresponding to the LSB of the bit pattern. In another example, an example bit pattern of "11100" has a "Bit 0" located on a bit position corresponding to the LSB of the bit pattern and a "Bit 1" located next to a bit position on which the "Bit 0" is located.

Numerical values (simply referred to as "values") listed on columns 236 and 238 are incremented in particular manners. For example, as shown in FIG. 2B, the values of column 236 are incremented over rows (sequentially from top to bottom) by 1. The values of column 238 are incremented in a manner that resembles increments shown in Pascal's triangle, in which each number in the triangle is the sum of the two numbers directly above it (e.g., in the row immediately above). Accordingly, as used herein, the table 216 can be alternatively referred to as "Pascal's triangle table". For example, each value of column 238 is a sum of a first value on a preceding row of column 238 and a second value on the same row as the respective value, but on column 236. For example, as indicated by arrows pointing "3" of column 238, "3" of column 238 is a sum of "1" (corresponding to the first value stated above) on a preceding row of column 238 and "2" (corresponding to the second value stated above) of the same row, but on column 236. In another example, "6" of column 236 is a sum of "3" (corresponding to the first value stated above) on a preceding row of column 238 and "3" (corresponding to the second value stated above) on the same row, but on column 236.

Once values on columns 236 and 238 are identified and/or determined (e.g., calculated) during encoding or decoding process, respective values on column 234 and that are on the same row as the identified/determined values on column 236 and 238 can be used to identify a respective amount of bit positions (alternatively referred to as "shift amount") each logical "0" has shifted and/or is to be shifted relative to a respective logical "0" on a corresponding base bit pattern. For example, during the encoding process, identified shift amounts can be respectively used to generate a bit pattern whose logical "0"s are shifted by the respective shift amounts relative to a corresponding base bit pattern. For example, the during decoding process, shift amounts can be identified by comparing a bit pattern and a corresponding base bit pattern to determine respective shift amounts. In this example, the identified shift amounts can be used to determine a corresponding overall rank to further result in a bit pattern corresponding to decoded user data. Further details of how to utilize information of table 216 for encoding and decoding schemes are respectively described in connection with FIGS. 3-4.

FIG. 3 illustrates a flow diagram 350 of an encoding process of user data in accordance with some embodiments of the present disclosure. Although embodiments are not limited so, the method described by the flow diagram 350 can be performed by the memory sub-system controller 115, such as conversion component 101 using information stored on tables 112-1, . . . , 112-N illustrated in FIG. 1.

At 352, an overall rank (as indicated by column 232 illustrated in FIG. 2A) assigned to a particular bit pattern (e.g., 4 bits) of user data that is being encoded can be identified, for example, using at least one of the tables 112-1, . . . , 112-N that stores information corresponding to a direct mapping between bit patterns and overall ranks.

At 354, a group rank (as indicated by column 226 illustrated in FIG. 2A) assigned to the identified overall rank can be determined (e.g., calculated) based on a difference between the identified overall rank and a rank offset that is greater than the other rank offsets but is still less than the identified overall rank. For example, if the overall rank is assumed to be "10" on column 228 of table 213, the group rank "4" (e.g., on column 226 of table 213) that is determined by subtracting the rank offset "6" from the overall rank "10" can be determined as corresponding to the overall rank "10".

At 356, a value corresponding to a "Bit 1" illustrated in FIG. 2B (as indicated by column 238 illustrated in FIG. 2B) that is larger than the other "Bit 1" values on column 236, but is still less than the group rank is identified. As described herein, a "Bit 0" is a logical "0" of the bit pattern (e.g., an encoded bit pattern, a base bit pattern, etc.) located closer to the MSB than the other logical "0" (e.g., "Bit 0") or on a bit position corresponding to the MSB of the bit pattern. For example, given that the group rank is determined at 354 to be "4", the largest value less than "4" on column 238 is "3".

At 358, a shift amount on the column 234 and the same row as the "Bit 1" value (identified at 356 of the flow diagram 350) on column 238 is identified. For example, given that the value is identified to be "3" at 356, "3" on column 236 (of table 216) corresponds to row 248; therefore, the value on the column 234 of the same row is "2" in view of table 216 illustrated in FIG. 2B.

At 360, a difference between the group rank and the value (identified at 356 of the flow diagram 350) is determined. For example, given that the group rank is determined to be "4" at 354 and the value identified at 356 is assumed to be "3", the difference between the group rank "4" and the value (identified at 356) "3" is "1".

At 362, a value corresponding to a "Bit 0" illustrated in FIG. 2B (as indicated by column 236 illustrated in FIG. 2B) that is larger than the other "Bit 0" values on column 236, but is still less than or equal to the difference (determined at 360 of the flow diagram 350) is determined. As described herein, a "Bit 1" is a logical "0" of the bit pattern (e.g., an encoded bit pattern, a base bit pattern, etc.) located closer to the LSB than the other logical "0" (e.g., "Bit 1") or on a bit position corresponding to the LSB. For example, given that the difference is determined to be "1" at 360, the value on column 238 (of table 216) that is larger than the other values on column 238 (of table 216) but is less than or equal to the difference "1" is "1" on row 244 of column 236. This "Bit 0" value can further corresponds to a shift amount for the "Bit 0" (since a "Bit 0" value and a shift amount on the same row has a same value as shown in table 216).

At 364, an encoded bit pattern can be determined based on the shift amounts determined at 358 and 362. In the example described above, an encoded bit pattern can include a "Bit 1" whose bit position has been shifted by "2" (as determined at 358) relative to a "Bit 1" of a base bit pattern and a "Bit 0" whose bit position has been shifted by "1" (as determined at 362) relative to a "Bit 0" of the base bit pattern. As a result, continuing with this example, the encoded bit pattern can be determined to be "10101".

FIG. 4 illustrates a flow diagram 470 of a decoding process of the encoded user data in accordance with some embodiments of the present disclosure. Although embodiments are not limited so, the method described by the flow diagram 470 can be performed by the memory sub-system controller 115, such as conversion component 101 using information stored on tables 112-1, . . . , 112-N illustrate in FIG. 1.

At 472, a group to which an encoded bit pattern (corresponding to encoded user data) belongs can be identified based on a quantity of logical "0"s (alternatively referred to as a "weight") the bit pattern includes and in view of a table (e.g., the table 213 illustrated in FIG. 2B). For example, an example encoded bit pattern of "01011" includes two logical "0"s, which indicates that "01011" belongs to the group "2" in table 213 illustrated in FIG. 2A.

At 474, a respective shift amount for each logical "0" in the encoded bit pattern relative to a respective logical "0" of a base bit pattern of the group (identified at 472) can be determined. As used herein, a logical "0" (of the example encoded bit pattern or the base bit pattern) and located closer to or on a bit position corresponding to the MSB of the example encoded bit pattern is referred to as a "first logical "0"", while a logical "0" of the example encoded bit pattern and located closer to or on the LSB of the example encoded bit pattern than the first logical "0" is referred to as a "second logical "0"". For example, the example encoded bit pattern of "01011" is compared to the base bit pattern of "11100" of group "2" of the table 213, and it is determined that the first logical "0" of the example encoded bit pattern has shifted by three relative to the first logical "0" of the base bit pattern, while the second logical "0" of the example encoded bit pattern has shifted by two relative to the second logical "0" of the base bit pattern.

At 476, the respective shift amount determined at 474 for each logical "0" can be used to identify respective "Bit 1" (e.g., the value on column 238 of table 216 illustrated in FIG. 2B) and "Bit 0" (e.g., the value on column 236 of table 216 illustrated in FIG. 2B) values. For example, given the example, in which the shift amount for the first logical "0" (corresponding to "Bit 1" of table 216) was determined (e.g., at 474) to be "3" for the example encoded bit pattern "01011", a value on column 238 (corresponding to "Bit 1") and a row having a numerical value corresponding to "3" (e.g., a fourth row 248 among rows that are indexed from 0 to 3) is "6", which can be determined to be a "Bit 1" value. Further, in the same example, in which the shift amount for the second logical "0" (corresponding to "Bit 0" of table 216) was determined (e.g., at 474) to be "2" for the example encoded bit pattern "01011", a value on column 236 (corresponding to "Bit 0") and a row having a numerical value corresponding to "2" (e.g., a third row 246 among rows that are indexed from 0 to 3) is "2", which can be determined to be a "Bit 0" value.

At 478, the values determined at 476 can be summed and a result of the sum can correspond to a group rank of the encoded bit pattern. For example, the values determined at 476 for the example encoded bit pattern "01011" is 8 (2+6=8), which corresponds to a group rank for "01011". At 480, the group rank determined at 478 can be summed with a rank offset (an overall rank assigned to a base bit pattern of the same group) to result in an overall rank of the encoded bit pattern (that is to be decoded). For example, once it is determined that the example encoded bit pattern of "01011" has a group rank of 8, an overall rank of the example encoded bit pattern can be determined by adding "8" to the rank offset (e.g., identified to be "6" based on table 213) of the base bit pattern of group 2 of table 213, which results in the overall rank to be 14.

At 482, the determined overall rank can be used to further identify a bit pattern corresponding to decoded user data. For example, once it is determined that the overall rank for the example encoded bit pattern of "01011" is 14, a bit pattern that further corresponds to an overall rank of 14 can be determined to be a decoded bit pattern.

Figure 5:
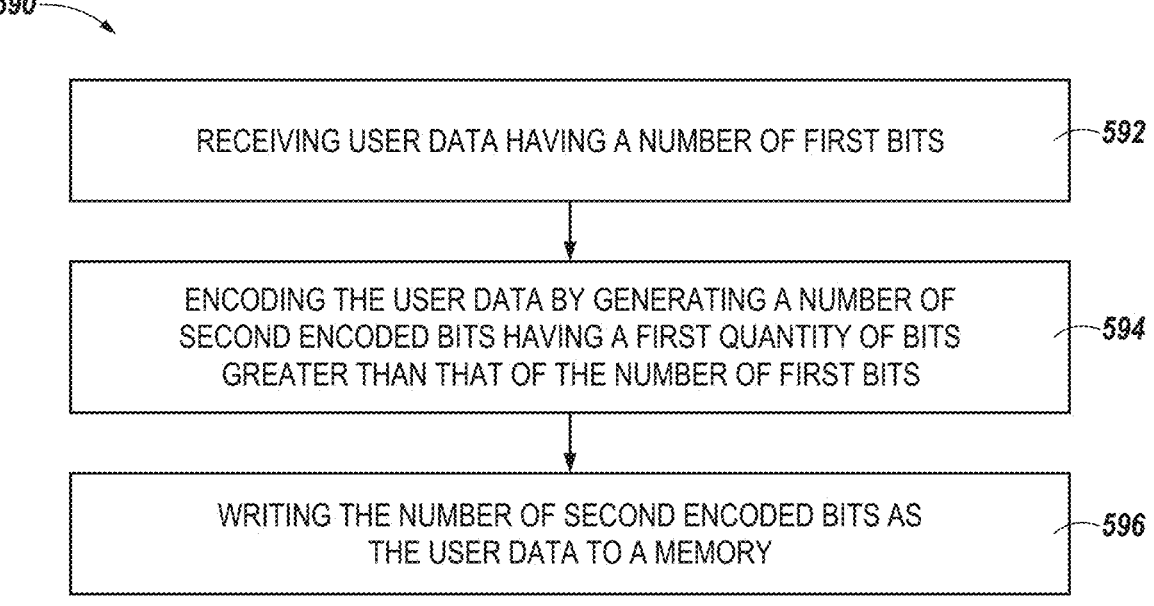
FIG. 5 illustrates a flow diagram corresponding to a method for a data encoding and decoding schemes in accordance with some embodiments of the present disclosure.

FIG. 5 illustrates a flow diagram corresponding to a method 590 for a data encoding and decoding schemes in accordance with some embodiments of the present disclosure. The method 590 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 590 is performed by the memory sub-system controller 115 and/or the conversion component 101 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At 592, user data having a number of first bits can be received (e.g., at the memory sub-system controller 115). At 594, the user data can be encoded by generating a number of second encoded bits having a first quantity of bits greater than that of the number of first bits. The number of second encoded bits can include one or more bits having a particular binary value and a quantity of the one or more bits is less than a threshold quantity. At 596, the number of second encoded bits as the user data can be written to a memory (e.g., memory devices 130, 140).

In some embodiments, encoding the user data can further involve identifying a first overall rank (e.g., listed in column 228 of table 213) assigned to the number of first bits. Further, the number of second encoded bits can be identified based on the first overall rank.

Continuing with this example, the first overall rank assigned to the number of first bits can be identified by determining a respective shift amount (e.g., listed in column 234 of table 216) corresponding to a respective bit position of each bit of a base bit pattern and having the particular binary value. In this example, the base bit pattern can include a same quantity of bits with the particular binary value as the number of second encoded bits. The base bit pattern can further include a number of third bits having the particular binary value among bits of the base bit pattern, the number of third bits located consecutively from a bit position of the base bit pattern that corresponds to a least most significant bit (LSB). In this example, each bit of one or more bits having the particular binary value among the number of second encoded bits is shifted by the respective shift amount relative to a bit position of a corresponding bit of the number of third bits of the base bit pattern.

Continuing with this example, a second overall rank (e.g., listed in column 228 of table 213) assigned to the base bit pattern can be identified in a first table (e.g., table 216). In this example, the first table can include a first column (e.g., column 234 of table 216) including a plurality of shift amounts respectively rows of the first table, in which a shift amount in each row is incremented by one compared to a shift amount in a respective preceding row of the first column. The first table can further include a second column (e.g., column 234 of table 216), in which a numerical value in each row is incremented by one compared to a numerical value in a respective preceding row of the second column. The first table can further include a third column (e.g., column 238 of table 216), in which each numerical value in a respective row (e.g., one of rows 242, 244, 246, and 248 of table 216) is a sum of a numerical value on a preceding row and the third column and a numerical value on the second column and the same row as the respective row of the first column. Further, the first and second overall ranks can be compared to determine a group rank assigned to the number of second encoded bits.

To determine the respective shift amount, the second overall rank can be compared to at least one of numerical values on the third column to determine a first shift amount corresponding to a first bit (e.g., "Bit 1" shown in table 216) of the number of third bits, wherein the first bit is a most significant bit of the number of third bits. Further, a result of the comparison between the second overall rank and the at least one of numerical values on the third column can be compared to at least one of numerical values on the second column to determine a second shift amount corresponding to a second bit (e.g., "Bit 0" shown in table 216) of the number of third bits.

In some embodiments, the number of second encoded bits can be read from the memory. To decode the number of second encoded bits, the first overall rank assigned to the number of second encoded bits can be determined by comparing the number of second encoded bits to the base bit pattern. Further, a number of fourth decoded bits corresponding to the first overall rank can be identified. In this example, the number of fourth decoded bits can indeed correspond to the number of first bits.

Continuing with this example, to determine the first overall rank, a respective shift amount that a bit position of each bit of the number of second encoded bits and having the particular binary value is shifted relative to a bit position of a respective bit of the number of third bits can be determined. Further, the first overall rank can be determined based on respective numerical values on the second and third columns of the first table and on respective rows each having a numerical value corresponding to the determined respective shift amount.

Figure 6:
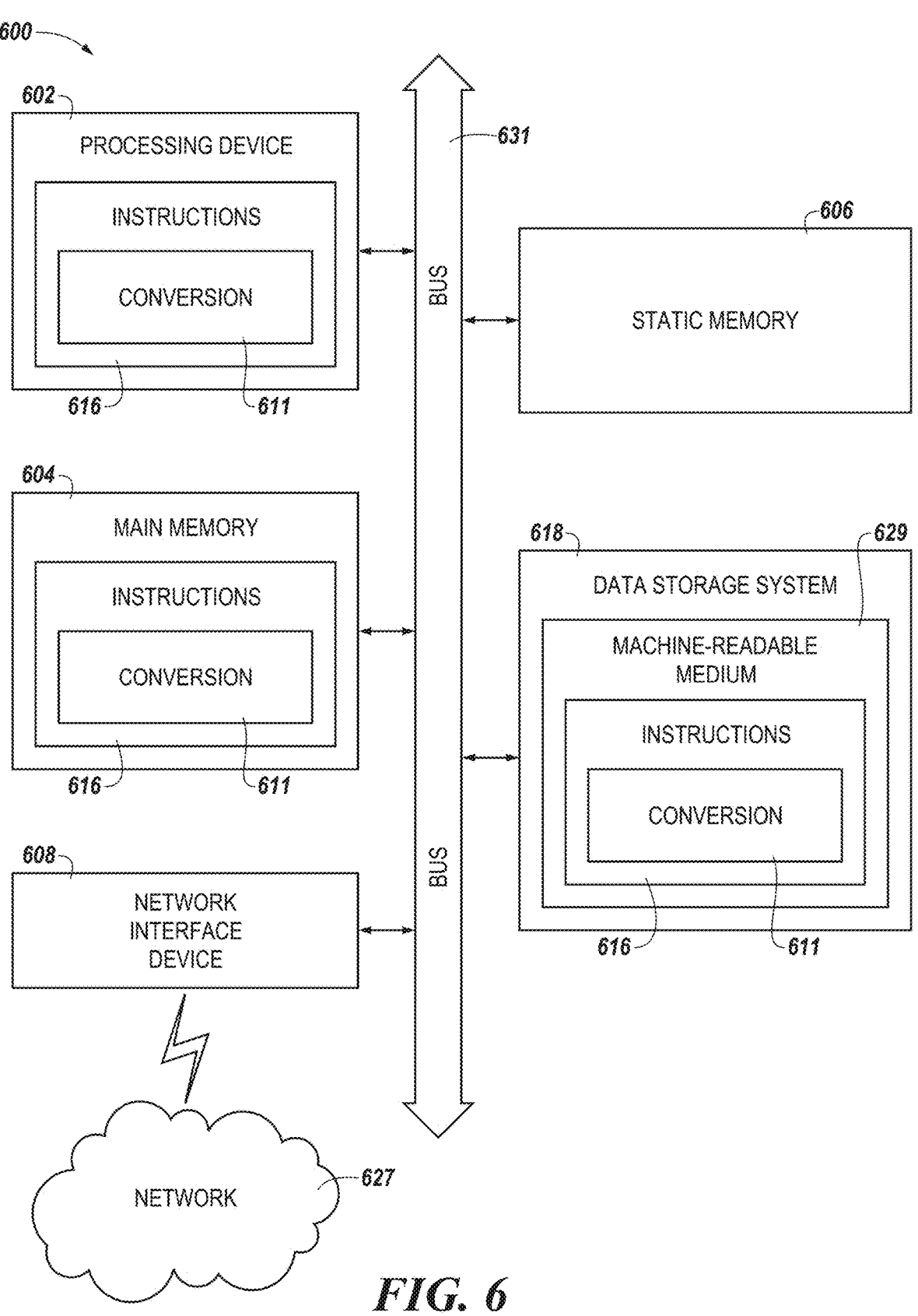
FIG. 6 illustrates a block diagram of an example computer system in which embodiments of the present disclosure may operate.

FIG. 6 illustrates a block diagram of an example computer system 600 in which embodiments of the present disclosure may operate. For example, FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the conversion component 101 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 631.

The processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 616 for performing the operations and steps discussed herein. The computer system 600 can further include a network interface device 608 to communicate over the network 627.

The data storage system 618 can include a machine-readable storage medium 629 (also known as a computer-readable medium) on which is stored one or more sets of instructions 616 or software embodying any one or more of the methodologies or functions described herein. The instructions 616 can also reside, completely or at least partially, within the main memory 604 and/or within the processing device 602 during execution thereof by the computer system 600, the main memory 604 and the processing device 602 also constituting machine-readable storage media. The machine-readable storage medium 629, data storage system 618, and/or main memory 604 can correspond to the memory sub-system 110 of FIG. 1.

In one embodiment, the instructions 616 include instructions to implement functionality corresponding to a conversion component 101 (e.g., the conversion component 101 of FIG. 1). While the machine-readable storage medium 629 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

The invention claimed is:

1. A method, comprising:
receiving user data having a number of first bits;
encoding the user data by generating a number of second encoded bits having a first quantity of bits greater than that of the number of first bits, wherein the number of second encoded bits includes one or more bits having a particular binary value and wherein a quantity of the one or more bits is less than a threshold quantity; and
writing the number of second encoded bits as the user data to a memory.

2. The method of claim 1, wherein encoding the user data further comprises:
identifying a first overall rank assigned to the number of first bits; and
identifying the number of second encoded bits based on the first overall rank.

3. The method of claim 2, wherein identifying the first overall rank assigned to the number of first bits further comprises:
determining a respective shift amount corresponding to a respective bit position of each bit of a base bit pattern and having the particular binary value, wherein the base bit pattern includes:
a same quantity of bits with the particular binary value as the number of second encoded bits; and
a number of third bits having the particular binary value among bits of the base bit pattern, the number of third bits located consecutively from a bit position of the base bit pattern that corresponds to a least most significant bit (LSB); and
wherein each bit of one or more bits having the particular binary value among the number of second encoded bits is shifted by the respective shift amount relative to a bit position of a corresponding bit of the number of third bits of the base bit pattern.

4. The method of claim 3, wherein determining the respective shift amount corresponding to the respective bit position of each bit of the base bit pattern and having the particular binary value further comprises:
identifying, in a first table, a second overall rank assigned to the base bit pattern, wherein the first table comprises:
a first column comprising a plurality of shift amounts respectively rows of the first table, in which a shift amount in each row is incremented by one compared to a shift amount in a respective preceding row of the first column;

a second column, in which a numerical value in each row is incremented by one compared to a numerical value in a respective preceding row of the second column; and a third column, in which each numerical value in a respective row is a sum of:

a numerical value on a preceding row and the third column; and a numerical value on the second column and the same row as the respective row of the first column; and comparing the first and second overall ranks to determine a group rank assigned to the number of second encoded bits.

5. The method of claim 4, further comprising:

determining the respective shift amount corresponding to the respective bit position of each bit of the base bit pattern and having the particular binary value by:

comparing the second overall rank to at least one of numerical values on the third column to determine a first shift amount corresponding to a first bit of the number of third bits, wherein the first bit is a most significant bit of the number of third bits; and comparing, to determine a second shift amount corresponding to a second bit of the number of third bits, a result of the comparison between:

the second overall rank and the at least one of numerical values on the third column; and at least one of numerical values on the second column.

6. The method of claim 4, further comprising:

reading the number of second encoded bits from the memory; and decoding the number of second encoded bits by:

determining the first overall rank assigned to the number of second encoded bits by comparing the number of second encoded bits to the base bit pattern; and identifying a number of fourth decoded bits corresponding to the first overall rank, wherein the number of fourth decoded bits corresponds to the number of first bits.

7. The method of claim 6, wherein determining the first overall rank assigned to the number of second encoded bits by comparing the number of second encoded bits to the base bit pattern further comprises:

determining a respective shift amount that a bit position of each bit of the number of second encoded bits and having the particular binary value is shifted relative to a bit position of a respective bit of the number of third bits; and determining the first overall rank based on respective numerical values on the second and third columns of the first table and on respective rows each having a numerical value corresponding to the determined respective shift amount.

8. An apparatus, comprising:

a memory; and a controller coupled to the memory, the controller configured to:

identify, in response to receiving user data having a number of first bits and to encode the user data, a first numerical value corresponding to a first overall rank of a plurality of overall ranks distributed across a plurality of groups, wherein:

the first overall rank is assigned to the number of first bits; and each group of the plurality of groups includes one or more bit patterns that includes a same quantity of bits having a particular binary value; and write, in response to a number of second bits being determined as corresponding to the first overall rank, the number of second bits to the memory as the encoded user data, wherein the number of second bits includes:

a first quantity of bits greater than that of the number of first bits; and a second quantity of bits having the particular binary value among the number of second bits, the second quantity of bits less than a threshold quantity.

9. The apparatus of claim 8, wherein the controller is configured to:

apply, to write the number of second bits to a group of memory cells of the memory, one or more programming voltages to one or more memory cells of the group to be programmed to the particular binary value; and not apply a programming voltage to memory cells of the group to be programmed to a different binary value.

10. The apparatus of claim 8, wherein the threshold quantity is equal to or less than a half of the first quantity.

11. The apparatus of claim 8, wherein:

the first overall rank is one of overall ranks corresponding to a first group of the plurality of groups; and the controller is further configured to:

determine a second numerical value corresponding to a second overall rank assigned to a base bit pattern of the first group and that is less than the other numerical values corresponding to the other overall ranks of the first group, wherein bits having the particular binary values among bits of the base bit pattern are located consecutively from a bit position of the base bit pattern and corresponding to a least most significant bit (LSB); and determine a third numerical value corresponding to a first group rank among a plurality of group ranks of the first group based on a comparison between the first numerical value and the second numerical value.

12. The apparatus of claim 11, wherein the controller is further configured to identify, among a plurality of numerical values on a first column of a first table, a fourth numerical value that is greater than the other numerical values on the first column and less than the third numerical value.

13. The apparatus of claim 12, wherein a respective one of the plurality of numerical values of the first column is a result of a sum of a numerical value of the plurality of numerical values on a preceding row and a numerical value on a second column of the first table and the same row as the fourth numerical value.

14. The apparatus of claim 12, wherein a plurality of numerical values respectively on rows of a third column of the first table respectively corresponds a plurality of shift amounts, in which a shift amount in each row is incremented by one compared to a shift amount in a respective preceding row.

15. The apparatus of claim 12, wherein the number of second bits includes a first bit and a second bit each having the particular binary value among the number of second bits, wherein:

a bit position of the first bit is shifted by a first shift amount relative to a bit position of a third bit of the base bit pattern, wherein the first shift amount corresponds to a respective shift amount on the third column and the same row as the fourth numerical value; and a bit position of the second bit is shifted by a second shift amount relative to a bit position of a fourth bit of the base bit pattern, wherein:

the third bit is located closer to or on a bit position corresponding to a most significant bit (MSB) of the base bit pattern than the fourth bit is; and the second shift amount is equal to or less than a difference between the second and fourth numerical values.

16. An apparatus, comprising:

a memory configured to store a number of first encoded bits as user data, wherein one or more bits having a particular binary value among the number of first encoded bits is less than a threshold quantity; and a controller coupled to the memory, the controller configured to:

read the user data including the number of first encoded bits from the memory;

identify, to decode the user data, a first numerical value corresponding to a first overall rank among a plurality of overall ranks distributed across a plurality of groups and assigned to the first number of bits, wherein each group of the plurality of groups includes one or more bit patterns that include a same quantity of bits having the particular binary value; and generate, as a result of the number of first encoded bits being decoded, a number of second decoded bits, wherein the number of second decoded bits includes a first quantity of bits that is less than that of the number of first encoded bits.

17. The apparatus of claim 16, wherein the controller is configured to:

identify a second overall rank assigned to a base bit pattern of a first group of the plurality of groups, wherein:

bits having the particular binary value among bits of the base bit pattern are located consecutively from a bit position of the base bit pattern corresponding to a least most significant bit (LSB); and each one of bit patterns of the first group includes a same quantity of bits having the particular binary value as the number of first encoded bits; and determine, to identify the first overall rank, a group rank assigned to the number of first encoded bits based on a difference between the second overall rank and the group rank.

18. The apparatus of claim 17, wherein:

the number of first encoded bits comprises:

a first bit having the particular binary value; and a second bit having the particular binary value, wherein the first bit is located closer to or on a bit position corresponding to a most significant bit (MSB) of the number of first encoded bits than the second bit is;

the base bit pattern comprises:

a third bit having the particular binary value; and a fourth bit having the particular binary value, wherein the third bit is located closer to or on a bit position corresponding to a most significant bit (MSB) of the number of first encoded bits than the fourth bit is;

wherein the controller is configured to determine:

a first shift amount by which a bit position of the first bit is shifted relative to that of the third bit; and a second shift amount by which a bit position of the second bit is shifted relative to that of the fourth bit.

19. The apparatus of claim 18, wherein a first table comprises:

a first column comprising a plurality of shift amounts respectively on rows of the first table, in which a shift amount in each row is incremented by one compared to a shift amount in a respective preceding row of the first column;

a second column, in which a numerical value in each row is incremented by one compared to a numerical value in a respective preceding row of the second column; and a third column, in which each numerical value in a respective row is a sum of:

a numerical value on a preceding row and the third column; and a numerical value on the second column and the same row as the respective row of the first column.

20. The apparatus of claim 19, wherein the controller is configured to:

determine the group rank based on a sum of a second numerical value and a third numerical value, wherein:

the second numerical value is on the second column and a first row of the first table, wherein a numerical value on the first column and the first row further corresponds to the first shift amount; and the third numerical value is on the third column and a second row of the first table, wherein a numerical value on the first column and the second row further corresponds to the second shift amount; and determine the first overall rank based on a sum of the group rank and the second overall rank.

* * * * *